United States Patent
Stellman

(10) Patent No.: US 11,076,510 B2
(45) Date of Patent: Jul. 27, 2021

(54) HEAT MANAGEMENT DEVICE AND METHOD OF MANUFACTURE

(71) Applicant: Facebook Technologies, LLC, Menlo Park, CA (US)

(72) Inventor: Jeffrey Taylor Stellman, Seattle, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 44 days.

(21) Appl. No.: 16/102,435

(22) Filed: Aug. 13, 2018

(65) Prior Publication Data

US 2020/0053909 A1 Feb. 13, 2020

(51) Int. Cl.
*H05K 7/20* (2006.01)
*F28D 15/04* (2006.01)
*B23P 15/26* (2006.01)
*F28F 13/08* (2006.01)

(52) U.S. Cl.
CPC ............ *H05K 7/2099* (2013.01); *B23P 15/26* (2013.01); *F28D 15/043* (2013.01); *F28F 13/08* (2013.01); *H05K 7/20972* (2013.01)

(58) Field of Classification Search
CPC ... H05K 7/2099; H05K 7/20972; B23P 15/26; F28F 13/08; F28D 15/043
See application file for complete search history.

(56) References Cited

U.S. PATENT DOCUMENTS

| | | | |
|---|---|---|---|
| 640,534 A * | 1/1900 | Cheney | A61F 7/02 165/46 |
| 3,075,529 A * | 1/1963 | Young, Jr. | A61F 7/02 607/114 |
| 3,490,718 A * | 1/1970 | Vary | B64G 1/503 244/171.8 |
| 3,545,230 A * | 12/1970 | Morse | C08J 3/28 62/530 |
| 3,680,189 A * | 8/1972 | Noren | B21D 53/02 29/890.032 |
| 4,212,347 A * | 7/1980 | Eastman | F28D 15/0241 165/104.26 |

(Continued)

FOREIGN PATENT DOCUMENTS

KR 10-1762075 B1 7/2017

OTHER PUBLICATIONS

PCT International Search Report and Written Opinion, PCT Application No. PCT/US2018047744, dated Feb. 26, 2019, 15 pages.

*Primary Examiner* — Ljiljana V. Ciric
(74) *Attorney, Agent, or Firm* — Fenwick & West LLP

(57) ABSTRACT

A heat-management device includes an array of recesses distributed across an external surface of a thermally conductive body. The device includes an array of protrusions interspersed with the array of recesses that form a network of cavities within an internal volume of the thermally conductive body. The array of recesses and the array of protrusions define a non-planar interface that is complementary to a curved surface of a heat source. A fluid volume can be retained within the network of cavities at a pressure lower than atmospheric pressure. The heat management device includes a cooling operation mode wherein the fluid volume absorbs heat from the heat source through the non-planar interface and dissipates heat away from the heat source through the network of cavities.

23 Claims, 10 Drawing Sheets

(56) References Cited

U.S. PATENT DOCUMENTS

| | | | | |
|---|---|---|---|---|
| 4,523,636 A * | 6/1985 | Meijer | F28D 15/0233 | 122/366 |
| 4,563,375 A * | 1/1986 | Ulrich | F28F 3/12 | 165/46 |
| 4,971,142 A * | 11/1990 | Mergler | F28D 15/02 | 165/104.14 |
| 5,006,924 A * | 4/1991 | Frankeny | H01L 23/42 | 165/46 |
| 5,161,884 A * | 11/1992 | Siminovitch | F21V 29/004 | 362/294 |
| 5,213,153 A * | 5/1993 | Itoh | F28D 15/0275 | 165/104.33 |
| 5,216,580 A * | 6/1993 | Davidson | F28D 15/0266 | 361/700 |
| 5,253,702 A * | 10/1993 | Davidson | F28D 15/0233 | 165/80.4 |
| D343,686 S * | 1/1994 | Irwin, Jr. | D24/206 | |
| 5,560,423 A * | 10/1996 | Larson | F28D 15/0241 | 165/104.26 |
| 5,587,880 A * | 12/1996 | Phillips | F28D 15/0266 | 165/104.29 |
| 5,650,914 A * | 7/1997 | DiStefano | H01L 23/3672 | 165/185 |
| 5,704,416 A * | 1/1998 | Larson | F28D 15/0241 | 165/104.21 |
| 5,848,637 A * | 12/1998 | Lee | A23L 3/365 | 165/104.21 |
| 6,003,591 A * | 12/1999 | Campbell | F28D 15/0233 | 165/104.26 |
| 6,082,443 A * | 7/2000 | Yamamoto | F28D 15/0233 | 165/104.21 |
| 6,131,651 A * | 10/2000 | Richey, III | F28F 13/00 | 165/185 |
| 6,237,223 B1 * | 5/2001 | McCullough | B23P 15/26 | 257/E23.089 |
| 6,302,192 B1 * | 10/2001 | Dussinger | F28D 15/0233 | 165/104.21 |
| 6,397,935 B1 * | 6/2002 | Yamamoto | F28D 15/0233 | 165/104.21 |
| 6,490,160 B2 * | 12/2002 | Dibene, II | G06F 1/18 | 165/104.26 |
| 6,817,097 B2 * | 11/2004 | Sarraf | F28D 15/0233 | 29/890.032 |
| 6,874,567 B2 * | 4/2005 | Ohara | F28D 15/0266 | 165/104.21 |
| 6,896,039 B2 * | 5/2005 | Dussinger | B22F 3/11 | 165/104.21 |
| 6,910,794 B2 * | 6/2005 | Rice | F28D 15/0233 | 362/547 |
| 7,063,127 B2 * | 6/2006 | Gelorme | H01L 23/433 | 165/185 |
| 7,167,366 B2 * | 1/2007 | Cheon | G06F 1/20 | 165/46 |
| 7,278,469 B2 * | 10/2007 | Sasaki | F28D 15/0241 | 165/104.26 |
| 7,324,341 B2 * | 1/2008 | Oman | H01L 23/427 | 165/104.26 |
| D560,947 S * | 2/2008 | Kreucher | D6/601 | |
| 7,369,410 B2 * | 5/2008 | Chen | F28D 15/0233 | 165/104.21 |
| 7,392,836 B2 * | 7/2008 | Wong | F28D 15/0233 | 165/104.26 |
| 7,399,919 B2 * | 7/2008 | McCutcheon | F28D 15/0241 | 174/16.3 |
| 7,540,318 B2 * | 6/2009 | Nitta | F28D 15/0233 | 165/104.26 |
| 7,604,782 B1 * | 10/2009 | Dingell | F25B 19/00 | 23/294 R |
| 7,678,614 B2 * | 3/2010 | Huang | H01L 23/373 | 438/122 |
| 7,926,553 B2 * | 4/2011 | Dautert | G06F 1/20 | 165/104.14 |
| 8,069,907 B2 * | 12/2011 | Bryant | F28D 15/04 | 165/46 |
| D657,832 S * | 4/2012 | Beber | D21/683 | |
| 8,448,693 B2 * | 5/2013 | Lundell | F28F 13/00 | 165/46 |
| 8,737,071 B2 * | 5/2014 | Hao | G06F 1/20 | 361/700 |
| 8,800,643 B2 * | 8/2014 | Pollard | B64D 33/08 | 165/170 |
| 8,813,834 B2 * | 8/2014 | Chin | H01L 23/427 | 165/104.26 |
| 9,279,626 B2 * | 3/2016 | Berukhim | F28F 9/028 | |
| 9,583,415 B2 * | 2/2017 | Yu | H01L 23/36 | |
| 9,939,210 B2 * | 4/2018 | Schultz | F28F 3/022 | |
| 9,995,537 B2 * | 6/2018 | Aoki | F28D 15/04 | |
| 10,356,945 B2 * | 7/2019 | Rush | H05K 7/20336 | |
| 10,365,047 B2 * | 7/2019 | Lassini | F28D 7/0025 | |
| 10,388,540 B2 * | 8/2019 | Brunschwiler | H01L 23/3736 | |
| 10,448,540 B2 * | 10/2019 | Hou | H05K 7/2029 | |
| 10,517,192 B2 * | 12/2019 | Hsiao | F28D 15/0233 | |
| 11,009,297 B2 * | 5/2021 | Smith | B64G 1/506 | |
| 2002/0021556 A1 | 2/2002 | Dibene et al. | | |
| 2002/0118511 A1 * | 8/2002 | Dujari | F28D 15/0233 | 361/703 |
| 2004/0118579 A1 | 6/2004 | McCutcheon et al. | | |
| 2006/0039111 A1 * | 2/2006 | Huang | H01L 23/427 | 361/698 |
| 2006/0118280 A1 * | 6/2006 | Liu | F28D 15/0233 | 165/104.33 |
| 2006/0196640 A1 * | 9/2006 | Siu | H01L 23/433 | 165/104.26 |
| 2007/0012429 A1 * | 1/2007 | Siu | F28F 21/062 | 165/104.33 |
| 2009/0040726 A1 * | 2/2009 | Hoffman | F28D 15/0233 | 361/700 |
| 2009/0283902 A1 * | 11/2009 | Bezama | H01L 23/3675 | 257/713 |
| 2011/0018125 A1 * | 1/2011 | Loo | H01L 23/16 | 257/706 |
| 2011/0209864 A1 * | 9/2011 | Figus | F28F 9/26 | 165/287 |
| 2012/0168435 A1 * | 7/2012 | Chen | F28D 15/04 | 220/6 |
| 2013/0199767 A1 * | 8/2013 | Karidis | B23K 31/02 | 165/185 |
| 2014/0190667 A1 * | 7/2014 | McGlen | F28D 15/0275 | 165/104.26 |
| 2014/0251585 A1 * | 9/2014 | Kusuda | F28D 15/04 | 165/164 |
| 2014/0268831 A1 * | 9/2014 | Shih | F21V 29/83 | 362/382 |
| 2015/0027669 A1 * | 1/2015 | Kokas | F28D 9/005 | 165/104.26 |
| 2015/0155218 A1 * | 6/2015 | Hung | H01L 23/42 | 257/690 |
| 2015/0189792 A1 * | 7/2015 | Kenna | F28F 1/14 | 361/704 |
| 2015/0262904 A1 * | 9/2015 | Hung | H01L 25/105 | 257/713 |
| 2016/0212886 A1 | 7/2016 | Nikkhoo | | |
| 2016/0255748 A1 * | 9/2016 | Kim | G02B 27/0176 | 361/695 |
| 2017/0184863 A1 | 6/2017 | Balachandreswaran et al. | | |
| 2019/0107342 A1 * | 4/2019 | Romanin | F28D 1/0308 | |
| 2020/0182549 A1 * | 6/2020 | Hall | F28D 7/0066 | |
| 2020/0238451 A1 * | 7/2020 | Rutkowski | B23P 15/26 | |
| 2020/0238452 A1 * | 7/2020 | Rutkowski | B23P 15/26 | |

* cited by examiner

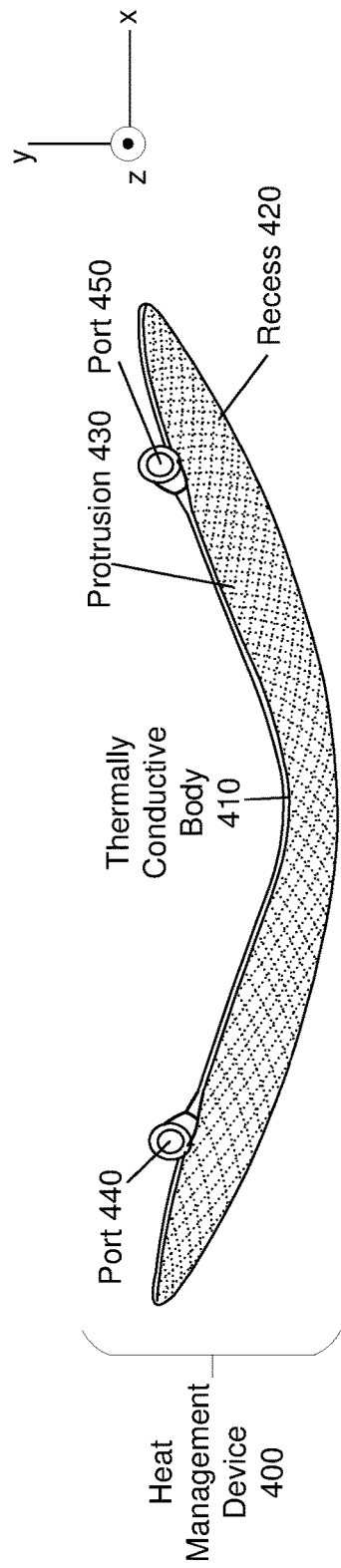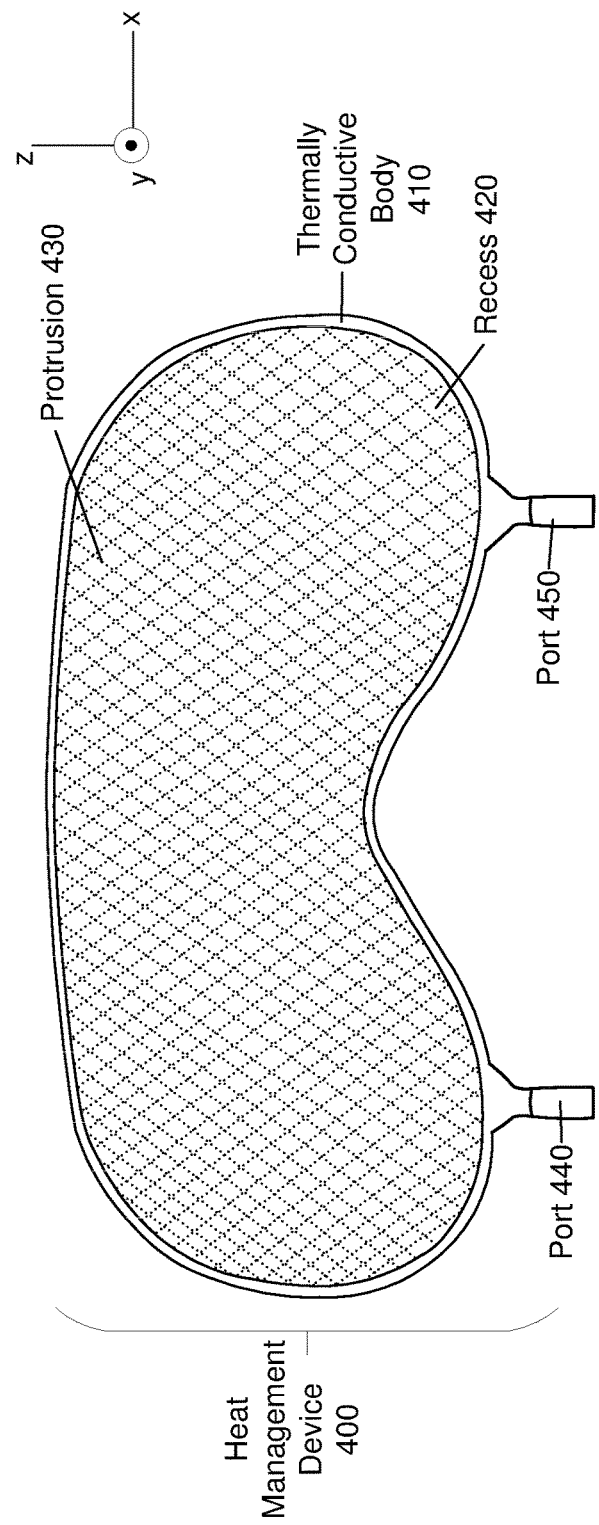

HEAT MANAGEMENT DEVICE AND METHOD OF MANUFACTURE

BACKGROUND

The present disclosure generally relates to heat management systems, and specifically to a printable heat management device.

Heat management devices function to transfer heat from a heat source, or otherwise maintain a thermal state of an object in a desired manner. In the context of computing systems, heat management devices can function to maintain or improve processing performance of such computing systems by preventing system overheating. However, traditional heat management devices are non-robust against deformation caused by thermally-induced stresses, and inefficiently transfer heat from heat-sources due to morphological design and manufacturing limitations. Additionally, conventional heat management systems have planar geometries, making them non-ideal for interfaces with curved surfaces.

SUMMARY

Embodiments relate to a system and method of manufacture of a heat management device. The system may include one or more vapor chambers that can be manufactured with custom morphologies. The one or more vapor chambers are composed of thermally-conductive materials that provide robustness against deformation, even with inclusion of smaller-than-typical features (e.g., wall thicknesses, mass-to-volume ratio of the system, etc.). Internal features of the system(s) described can facilitate heat dissipation in a cyclic manner due to phase changes of fluid volumes contained therein. Additionally or alternatively, internal and/or external features of the system(s) described can facilitate heat dissipation by way of conduction, convection (i.e., forced convection, natural convection), and/or radiation.

In some embodiments, the heat management device includes an array of recesses and an array of protrusions. The array of recesses includes a first subarray distributed across a first external surface of a thermally conductive body and a second subarray distributed across a second external surface opposing the first surface of the thermally conductive body. The array of protrusions is interspersed with the array of recesses and the arrays form a network of cavities within an internal volume of the thermally conductive body. The array of recesses and the array of protrusions define a non-planar interface complimentary to a curved surface of a heat source. A fluid volume is retained within the network of cavities at a pressure lower than atmospheric pressure. The heat management device has a cooling operation mode in which the fluid volume absorbs heat from the heat source through the non-planar interface and dissipates heat away from the heat source through the network of cavities.

In some embodiments, the heat management device is implemented in an artificial reality system having components that generate heat during operation. For example, the heat management system may be part of a head-mounted display, a near-eye display, a console, etc. Some embodiments of the heat management device couple to such components in a manner that provides an extremely efficient interface for heat transfer and dissipation of heat away from the heat-generating components. The heat management system may have one or more curved surfaces. The curved surfaces may allow for, e.g., efficient heat transfer from a curved surface of a heat source, efficient transfer of heat to a curved heat dissipation surface, etc. In some embodiments, the heat management device can also structurally support aspects of the artificial reality system, and provide robustness with a low-weight design.

Embodiments according to the invention are in particular disclosed in the attached claims directed to a heat-management device, a method, and a system, wherein any feature mentioned in one claim category, e.g. heat-management device, can be claimed in another claim category, e.g. method or system as well. The dependencies or references back in the attached claims are chosen for formal reasons only. However any subject matter resulting from a deliberate reference back to any previous claims (in particular multiple dependencies) can be claimed as well, so that any combination of claims and the features thereof is disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

In an embodiment a heat-management device may comprise:

an array of recesses comprising a first subarray distributed across a first external surface of a thermally conductive body;

an array of protrusions interspersed with the array of recesses and forming a network of cavities within an internal volume of the thermally conductive body, the array of recesses and the array of protrusions defining an interface configured to be positioned adjacent to a surface of a heat source; and wherein a fluid volume is retained within the network of cavities, the heat management device having a cooling operation mode wherein the fluid volume absorbs heat from the heat source through the interface and dissipates heat away from the heat source through the network of cavities.

The thermally conductive body may comprise a selective laser melting (SLM™)-printed material.

The SLM™-printed material may comprise at least one of a material including titanium, a material including tungsten, and a material including steel.

The array of recesses and the array of protrusions may comprise curved edges.

The thermally conductive body may be physically mounted to the heat source and provides structural support to the heat source.

The array of recesses may comprises a second subarray distributed across a second external surface opposing the first surface of the thermally conductive body, and the first subarray may be coupled to the second subarray of the array of recesses within the internal volume, thereby defining the network of cavities as a lattice network of channels.

The lattice network of channels formed within the thermally conductive body may provide the thermally conductive body with a structural stiffness resistant to deformation of the thermally conductive body caused by the pressure lower than atmospheric pressure and induced thermal stresses in the cooling operation mode.

The interface may be a non-planar interface and the surface of the heat source may be a curved surface, and the non-planar interface may have a curvature that is complimentary to the curved surface of the heat source.

In a flushing operation state, the thermally conductive body may comprise a pair of ports that transmit metal powder from within the internal volume, and in a sealing operation state, a first port of the pair of ports may be sealed and a second port of the pair of ports may facilitate depressurization and transmission of the fluid volume into the internal volume.

External surfaces of the thermally conductive body may comprise a surface sealing treatment comprising at least one of an epoxy coating and particle impregnation.

The heat source may be a component of a head-mounted display (HMD), and the curved surface may comprise a curved surface of a face plate of the HMD.

Some recesses of the array of recesses may each include a respective opening, and each channel may allow air to flow through the opening between the first external surface and the second external surface of the thermally conductive body.

In an embodiment a heat-management device may comprise a fan that blows air through each of the openings.

A wall between a cavity of the network of cavities and the first external surface may be at most 200 microns thick.

The network of cavities may comprise a first layer of channels at a first depth within the thermally conductive body and a second layer of channels at a second depth within the thermally conductive body.

In the cooling operation mode, the fluid volume in a liquid state may absorb heat from the heat source through the non-planar interface, undergo a phase transition to a gas state, return to the liquid state upon dissipating heat away from the heat source, and travel back toward the non-planar interface through the network of cavities.

The fluid volume may be retained within the network of cavities at a pressure lower than atmospheric pressure.

The interface may provide coverage of a portion of the surface of the heat source.

In an embodiment a method, in particular for manufacturing a heat-management device according to the invention or any of the embodiments mentioned herein, may comprise:
  forming an array of recesses comprising a first subarray distributed across a first external surface of a thermally conductive body;
  forming an array of protrusions interspersed with the array of recesses and defining a network of cavities within an internal volume of the thermally conductive body, the array of recesses and the array of protrusions defining an interface configured to be positioned adjacent to a surface of a heat source; and
  retaining a fluid volume within the network of cavities, the heat management device having a cooling operation mode wherein the fluid volume absorbs heat from the heat source through the interface and dissipates heat away from the heat source through the network of cavities.

Forming the array of recesses and the array of protrusions may comprise generating data defining morphology of a body comprising the array of recesses and the array of protrusions.

Forming the array of recesses and the array of protrusions may comprise transforming the data into parameters of a set of cross sections of the body, and for each of the set of cross sections of the body:
  adjusting a height of a print bed substrate, the height corresponding to the cross section of the body,
  depositing powdered metal material in a uniform layer across the print bed substrate, and
  bonding, using a laser, powdered metal material of the uniform layer to a running build of the body, based upon the cross section.

In an embodiment a method may comprise sealing surface imperfections of the thermally conductive body upon performing at least one of: dipping external surfaces of the thermally conductive body in an epoxy material and applying an impregnation process to external surfaces of the thermally conductive body.

In an embodiment a method may comprise: by way of the pair of ports, transmitting metal powder from within the internal volume of the thermally conductive body with a flushing operation, sealing a first port of the pair of ports, and transmitting the fluid volume into the network of cavities at a pressure lower than atmospheric pressure through a second port of the pair of ports.

In an embodiment a system may comprise:
  A heat management device, in particular according to the invention or any of the embodiments mentioned herein, may be coupled to one or more heat-generating surfaces of a head-mounted display (HMD),
  wherein the HMD comprises:
  a housing retaining an electronic display in position, and electronic circuitry coupled to the electronic display, the electronic circuitry comprising a processor and memory comprising instructions in non-transitory computer-readable media for providing digital content at the display.

The heat-management device may comprise:
  a titanium body defining the array of recesses and the array of protrusions, wherein the titanium body is mounted to one or more of the heat-generating surfaces and provides structural support to the HMD, and
  wherein each cavity of the network of cavities has a characteristic diameter from 0.1-5 millimeters, wherein a wall between a cavity of the network of cavities and the first external surface is at most 200 microns thick.

BRIEF DESCRIPTION OF THE DRAWINGS

FIG. 4C depicts a bottom view of the example heat management device of FIG. 4A.

FIG. 4D depicts a front view of the example heat management device of FIG. 4A.

Figure 1A:
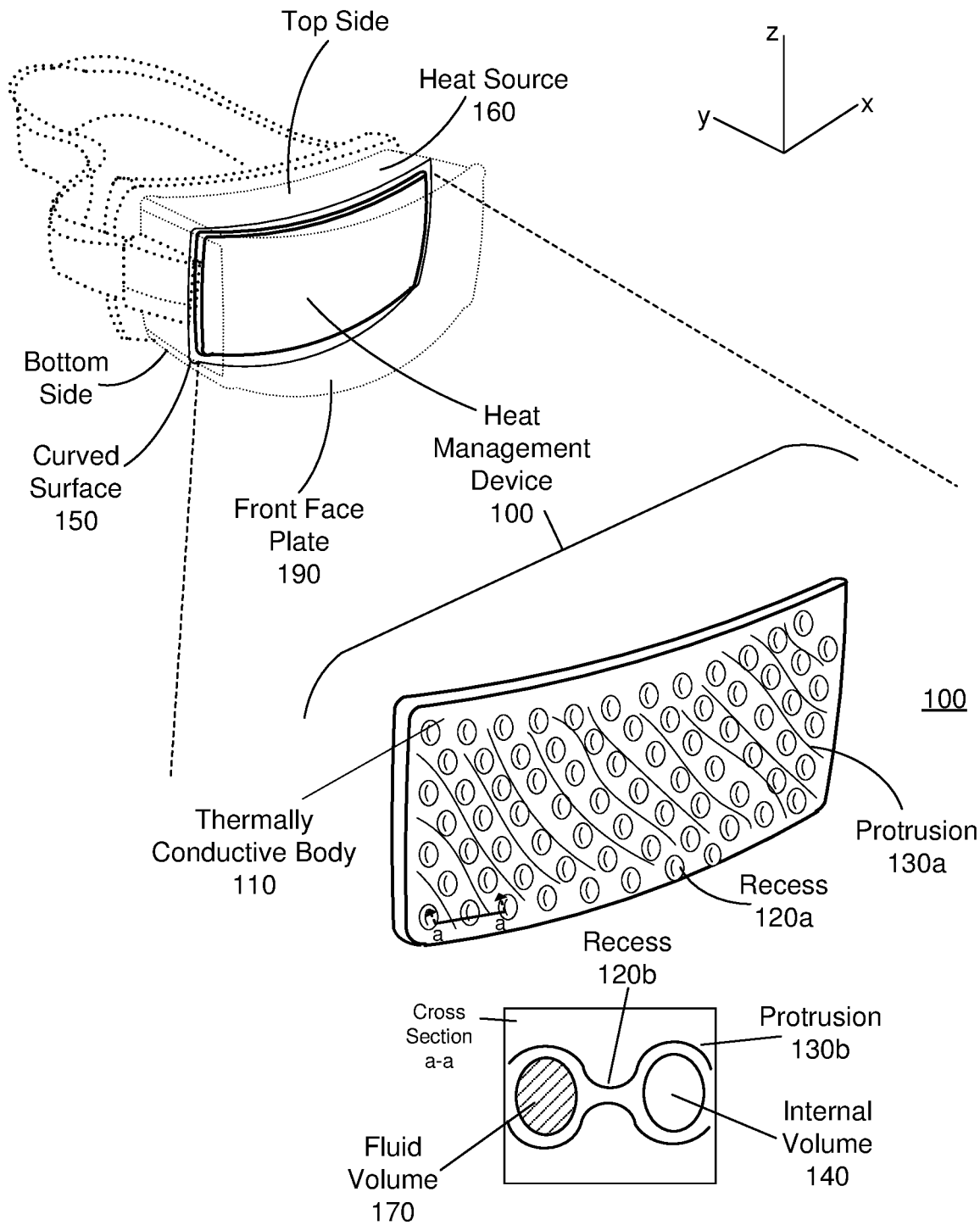
FIG. 1A depicts an isotropic view of a heat management device, in accordance with one or more embodiments.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Overview

A heat management devices includes structures and materials that absorb heat from a heat source and reject heat away from the heat source. The heat management device includes one or more vapor chambers that can be manufactured with custom morphologies that promote heat transfer from non-planar or planar surfaces of heat sources. In relation to manufacturing with custom morphologies, the heat management devices can be printed (e.g., 3D printed) using processes for creating complex custom geometries with metal materials.

The one or more vapor chambers are composed of thermally-conductive materials that provide robustness against deformation, even with inclusion of smaller-than-typical features (e.g., wall thicknesses, mass-to-volume ratio of the system, etc.). Internal features of the system(s) described can facilitate heat dissipation in a cyclic manner due to phase changes of fluid volumes contained therein. Additionally or alternatively, internal and/or external features of the system(s) described can facilitate heat dissipation by way of conduction, convection (i.e., forced convection, natural convection), and/or radiation.

The heat management device functions to efficiently transfer heat from and dissipate heat away from a heat source. In the context of computing systems generating heat, the heat management device can function to improve or maintain proper performance of the computing systems by providing structures for efficient transfer of heat from the computing systems. As such, embodiments of the heat management device can enable greater performance from associated computing systems with devices similar in size to traditional heat management devices, or can alternatively enable approximately equivalent performance from associated computing systems with devices much smaller in size than traditional heat management devices.

The heat management device can additionally or alternatively function to provide structural support to systems or devices associated with the heat source, by utilizing thermally conductive materials having mechanical properties and/or structural features more suited to providing structural support than materials traditionally used in heat management devices. The heat management device can also function to resist deformation induced by thermal stresses (e.g., experienced during heat transfer) and/or lower-than-environmental pressures associated with internal contents of the heat management device, as attributed to material composition and/or structural features of the invention(s) described.

Heat Management Device

FIG. 1A depicts an isotropic view of a heat management device 100, in accordance with one or more embodiments. The heat management device 100 functions to facilitate heat transfer from a heat source. The heat management device 100 includes: a thermally conductive body 110; an array of recesses including recesses 120a and 120b distributed across an external surface of the thermally conductive body 110; an array of protrusions including protrusions 130a and 130b interspersed with the array of recesses and forming a network of cavities within an internal volume 140 of the thermally conductive body 110, the array of recesses and the array of protrusions defining a non-planar interface complementary to a curved surface 150 of a heat source 160; and a fluid volume 170 retained within the network of cavities.

The thermally conductive body 110 functions to provide a medium for facilitating effective heat transfer from a heat source, structurally supporting other elements, and resisting deformation due to stresses encountered during operation. The thermally conductive body 110 can include the array of recesses including recesses 120a and 120b and/or the array of protrusions including protrusions 130a and 130b as custom manufactured features. In relation to manufacturing custom features, the thermally conductive body 110 can be printed (e.g., 3D printed) using processes for creating complex custom geometries with metal materials as described below.

In material composition, the thermally conductive body 110 can be composed of a thermally conductive material that effectively transfers heat across surfaces of the thermally conductive body 110. As such, the thermally conductive body 110 can be composed of a material that has a sufficiently high thermal conductivity (k) at temperatures experienced during operation of the heat management device. The thermally conductive body 110 can additionally or alternatively have any other suitable thermal property (e.g., heat transfer coefficient, insulance, Nusselt number, etc.) associated with effective heat transfer between a heat source and another material. In variations, the thermally conductive body 110 can be composed of a material that has a thermal conductivity greater than 15 W/mK, and in specific examples, the thermally conductive body can be composed of one or a combination of: a material including titanium, a material (e.g., stainless steel, tool steel, etc.) including steel, an material including aluminum, a material including cobalt and chrome, a material including bronze, a material including a precious metal (e.g., gold, silver, etc.), a material including nickel, and any other suitable material having desired thermal properties.

In material composition, the thermally conductive body 110 can be composed of a material having mechanical properties suitable for structurally supporting other elements, and/or resisting deformation associated with stresses (e.g., thermally-induced stresses, pressure-derived stresses) encountered during operation of the heat management device 100. As such, the thermally conductive body 110 can have a tensile strength, a compressive strength, a shear strength, an elastic modulus, a hardness, a derivative of the above mechanical properties and/or other properties that enable structural support of other elements and resistance to deformation, in association with feature dimensions and operation modes described below. In specific examples, the thermally conductive body 110 can have a tensile strength greater than 150 MPa, a compressive strength greater than 150 MPa, a shear strength greater than 30 GPa, an elastic modulus greater than 100 GPa, and a Brinell hardness greater than 50, in addition to having suitable thermal properties.

In material composition, the thermally conductive body 110 can be composed of a material having suitable physical properties associated with application of use of components coupled to the heat management device. In the context of a device worn by a user, the thermally conductive body 110 can have one or more of an overall mass, an overall weight, a volume, density, and/or any other suitable physical property that supports a form factor that provides comfort to the user during a duration of use of the wearable device. In specific examples, due to material selection, morphological features, and low overall mass of the heat management device, the wearable device can have a low-weight, but structurally robust form factor that is comfortable for use over a duration of time.

The material of the thermally conductive body 110 is preferably able to be processed into powdered form and used in a manufacturing process that bonds layers of powder to a running build of the thermally conductive body, as described in more detail below. However, the material(s) of the thermally conductive body 110 can alternatively be processed from another initial form to form features described below, using another manufacturing process.

In variations, the thermally conductive body 110 can include materials and/or structural elements that reduce or otherwise eliminate interference with wireless transmission processes. As such, the thermally conductive body 110 can be configured to prevent interference with transmission of data between transmitter and/or receiver elements (e.g., across the body 110). In examples, the thermally conductive body 110 can include structures (e.g., waveguides) that support or improve signal transmission associated with transmitter and/or receiver elements. Additionally or alternatively, the thermally conductive body 110 can be coupled to one or more antennas for signal transmission.

In morphology, the thermally conductive body 110 has an external surface and an internal volume defined by external and internal features of the thermally conductive body 110 described in more detail below. The external surface is preferably a non-planar surface complimentary to a curved surface 150 of a heat source 160. The curved surface is 150 can be amorphous and have convex and/or concave features. The curved surface 150 can be defined by one or more splines (e.g., functions defined piecewise by polynomials and used for interpolating between points). As such, concave and/or convex aspects of the curved surface can be customized and not limited to standard curved morphologies, such as semispherical or semiellipsoidal morphologies. The curved surface 150 can additionally or alternatively include one or more of: closed cross-sectional geometries swept across a spline or other line, extrusions of closed cross-sectional geometries, surfaces of revolution about an axis, patches (e.g., bilinear patches, Bezier patches), and any other suitable curved features. The external surface can additionally or alternatively include non-curved features (e.g., edges, corners, etc.) associated with mounting or coupling to other system components, to provide structural support, for instance. Furthermore, while the thermally conductive body 110 of embodiments of the heat management device 100 described preferably interface with curved surfaces of heat sources, the thermally conductive body 110 can alternatively be configured to facilitate heat transfer from a non-curved surface (e.g., a planar surface, a surface having sharp edges, etc.) of a heat source.

The thermally conductive body 110 can also have another external surface associated with heat dissipation away from the heat source, and into another heat absorbing element, for instance. The other external surface can thus interface with a custom heat dissipation surface (e.g., front face plate 190 of a head mounted display) removed from the heat source. Similar to the curved surface 150 of the heat source 160, the custom heat dissipation surface interfacing with another surface of the thermally conductive body 110 can be amorphous and have convex and/or concave features not limited to standard curved morphologies.

In some embodiments, the thermally conductive body 110 can structurally interface with another system or device. As such, the thermally conductive body 110 can be physically mounted to the heat source 160 and provide structural support to the heat source 160. As illustrated in FIG. 1A, the thermally conductive body 110 and/or heat management device 100 as a whole can support a top side and a bottom side of a head-mounted display unit. In other embodiments, the thermally conductive body 110 and/or heat management device 100 can be used to provide support for other devices. In variations, mounting can implemented using fasteners (e.g., bolts, screws), thermal bonding processes, adhesive bonding processes (e.g., using an adhesive including high conductivity components), and/or any other suitable fasteners or processes.

As shown in FIG. 1A, the heat source 160 can be a component of a head-mounted display (HMD) (e.g., of an artificial reality system), and the curved surface 150 is a curved surface of a face plate of the HMD, wherein the curved surface is defined by a spline having two primary convex components separated by a concave component (e.g., corresponding to a user's face). However, the heat source 160 and/or curved surface 150 can be associated with components of any other suitable components of computing devices generating heat during processing operations. Still alternatively, the heat source can be associated with a non-computing system having components that would otherwise benefit from a heat management device.

The thermally conductive body 110 includes the array of recesses including recesses 120a and 120b, and the array of protrusions including protrusions 130a and 130b (e.g., as features manufactured in a single process, as contemporaneously manufactured features, etc.). Alternatively, the thermally conductive body 110 can support the array of recesses and/or the array of protrusions by providing a substrate from which recesses can be formed and/or protrusions can be coupled to (e.g., in distinct manufacturing processes).

The array of recesses function to define positions of the array of protrusions and features of the internal volume of the thermally conductive body 110. The array of recesses can also provide positions for elements that improve heat transfer (e.g., by forced and/or natural convection), as described in more detail below. In relation to the external surface of the thermally conductive body 110, the array of recesses are concave features defined across one or more faces of the thermally conductive body 110. The concave features of the array of recesses can be defined by any suitable curve. The recesses of the array of recesses are preferably identical or similar in dimension to each other, but the array of recesses can alternatively include non-identically sized recesses, in order to define non-uniform internal structures of the internal volume (e.g., in relation to heat transfer mechanisms associated with the fluid volume of the internal volume).

Figure 1B:
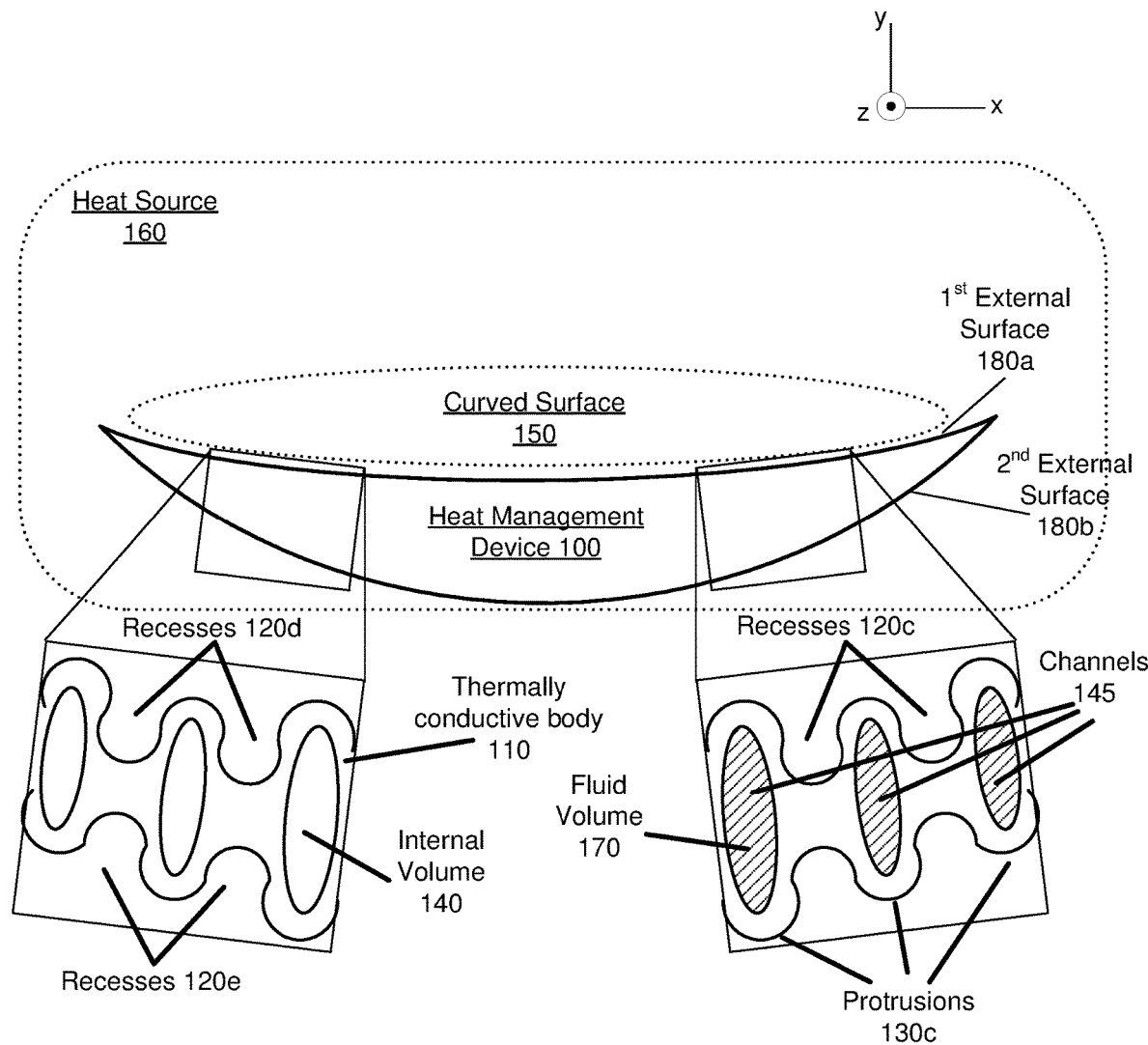
FIG. 1B depicts another view of the heat management device shown in FIG. 1A, in accordance with one or more embodiments.

FIG. 1B depicts another view of the heat management device 100 of FIG. 1A, in accordance with one or more embodiments. The view of the heat-management device 100 in FIG. 1B is in an X-Y plane. The array of recesses including recesses 120c, 120d, and 120e can include a first subarray 120d distributed across a first external surface 180a of the thermally conductive body 110 and a second subarray 120e distributed across a second external surface 180b opposing the first external surface 180a of the thermally conductive body 110. The first subarray 120d and the second subarray 120e preferably oppose each other across an imaginary surface defined between (e.g., defined midway between) the first external surface and the second external surface. The first subarray 120d and the second subarray 120e can further mirror each other across the imaginary surface, such that projections of positions of the first subarray 120d and the second subarray 120e onto a plane overlap with each other or otherwise align with each other. In relation to opposing surfaces of the thermally conductive body 110, the first subarray 120d can be coupled to the second subarray 120e of the array of recesses within the internal volume 140. Alternatively, the first subarray 120d can be separated from the second subarray 120e of the array of recesses by a gap within the internal volume 140. Positions of the first subarray 120d and the second subarray 120e can thus define features (e.g., cavity morphological features) of the internal volume 140, described further below in relation to the array of protrusions, including protrusions 130c.

The array of protrusions functions to provide surface area for heat transfer from the curved surface 150 of the heat source 160, and to define features of the internal volume 140 of the thermally conductive body 110, along with the array of recesses. In relation to surface area, the array of protrusions 130 can thus define an interface of thermal coupling between the heat source and contents of the internal volume 140, and can provide a larger surface for heat transfer compared to a smooth surface. The array of protrusions can also provide surface features that improve heat transfer (e.g., by forced and/or natural convection), as described in more detail below.

Protruding features of the array of protrusions are preferably defined in spaces between adjacent recesses of the array of recesses. In dimension, protruding features of the array of protrusions can have a characteristic width (e.g., measured between valleys of adjacent recesses) from 1-15 millimeters and/or a characteristic height (e.g., measured from a valley of an adjacent recess to a peak of the protrusion) from 1-15 millimeters.

Externally, the array of protrusions with the array of recesses 120 distributed across the external surface of the thermally conductive body 110 defines a non-planar thermal interface with the heat source. The heat source can be an object that generates heat directly or an intermediate object that receives heat from a direct heat generator for dissipation to the heat management device. Preferably, the non-planar interface provides a greater than 80% region of coverage with the curved surface of the heat source. However, the non-planar interface can provide another suitable region of coverage (e.g., greater than 50% coverage, greater than 60% coverage, greater than 70% coverage, greater than 90% coverage, greater than 99% coverage, etc.) with the heat source. Similarly, in relation to the other surface of the thermally conductive body associated with heat dissipation away from the heat source, the other surface can shaped to provide a suitable region of coverage (e.g., greater than 50% coverage, greater than 60% coverage, greater than 70% coverage, greater than 80% coverage, greater than 90% coverage, greater than 99% coverage, etc.) with a custom heat dissipation surface (e.g., front face plate of a head mounted display) away from the heat source.

Protrusions of the array of protrusions and recesses of the array of recesses can have curved edges. In relation to a method of manufacture described below, curved edges can prevent generation of processing artifacts (e.g., discontinuities generated at sharp corners or edges) associated with inertia of a traveling head of a three-dimensional (3D) printing system. As such, in relation to bounding features of the array of recesses 120 and/or the array of protrusions, corners and edges of the bounding features can have a radius of curvature greater than 1 millimeter; however, radii of curvature of protruding and/or recessed features can be smaller than 1 millimeter (e.g., in relation to alternative manufacturing processes described below).

Protrusions of the array of protrusions are hollow, thereby defining at least one cavity within the internal volume 140 of the thermally conductive body 110. In variations of the array of recesses where the first subarray 120d is coupled to the second subarray 120e of the array of recesses within the internal volume, the internal volume can be defined as a lattice network of channels 145 that allow flow of the fluid volume 170 through capillary features. Alternatively, in variations of the device 100 wherein backsides of recesses at opposing surfaces of the external surface of the thermally conductive body 110 are separated by a gap, the internal volume can be defined as a continuous, bulk volume having protrusions and/or recesses extending from a core volume.

Dimensionally, walls between cavities of the internal volume 140 and an external surface of the thermally conductive body 100 are preferably at most 200 microns thick. Similarly, walls between adjacent cavities of the internal volume 140 are preferably at most 200 microns thick, thereby providing the heat management device 100 with suitable wall thicknesses for heat transfer, while contributing to an overall low device weight. However, in alternative variations, wall thicknesses between the external surface and internal cavities and/or wall thicknesses between adjacent cavities can be greater than or equal to 200 microns thick.

In variations wherein the internal volume 140 is defined as a network of channels 145, the channels can have circular, ellipsoidal, polygonal, or amorphously-bounded cross sections. Cross sectional aspects, changes in cross section along the length of a channel, orientation relative to gravity, and/or other features can guide a direction of flow of the fluid volume 170 in liquid phase toward the heat source 160 (e.g. to absorb more heat from the heat source 160 in liquid phase) during stages of the cooling operation mode described in more detail below. For instance, channels can be configured with an appropriate radius in relation to surface tension aspects, liquid density, gravitational force, contact angle of the fluid, and desired length along which liquid should flow by capillary force. Additionally or alternatively, channels can be designed with a desired orientation to allow flow of the liquid toward the heat source 160 by gravitational force.

In variations wherein the channels comprise channels with ellipsoidal or circular cross sections, a channel can have a characteristic diameter from 0.1-5 millimeters; however, in variations, channels can alternative have a characteristic diameter smaller than 0.1 millimeters or greater than 5 millimeters. Furthermore, the network of channels 145 can include channels of uniform cross sectional dimensions, or alternatively varied cross sectional dimensions (e.g., in relation to cooling operation cycle phases). Similar to aspects of the array of recesses and the array of protrusions, in relation to structural robustness of the heat management device 100, the network of channels 145 formed within the thermally conductive body provides the thermally conductive body 110 with a structural stiffness resistant to deformation of the thermally conductive body caused by the pressure lower than atmospheric pressure and induced thermal stresses in the cooling operation mode, thereby providing a high strength-to-weight ratio of the device.

The network of channels 145 preferably has an open pathway across all channels, which can allow for flushing operations described below, with a reduced number of ports. However, the network of channels 140 can alternatively have multiple pathways including pathways distinct from each other (e.g., non-fluidly coupled channels). Additionally or alternatively, in some variations, the network of channels 232 can include multiple layers of channels, as described below.

The fluid volume 170 can be composed of a fluid that undergoes a phase change within the range of operating temperatures of the heat management device 100 and/or heat source 160. The phase change can be between a liquid phase and a gas phase, between a solid phase and a liquid phase, between a solid phase and a gas phase, or between other suitable phases (e.g., between different solid phases). As such, in some variations, the fluid volume can be substituted with a material volume that has a solid state at least at some portion of the cooling operation mode, as described below. In one variation, the fluid volume 170 is composed of water and the fluid volume 170 undergoes a phase transition between a liquid phase and a gas phase during operation of the heat management device 200. In alternative variations, the fluid volume 170 can include one or more of: ammonia, methanol, ethanol, or another alcohol. In still alternative variations, for heat sources operating in low temperature ranges (e.g., 1-5 K), the fluid volume 170 can include helium. In still alternative variations, for heat sources operating in higher temperature applications (e.g., 520-930 K), the fluid volume 170 can include mercury. In still alternative variations, for heat sources operating in even higher temperature applications (e.g., 870-1480 K), the fluid volume 170 can include sodium. In still alternative variations, for heat sources operating in even higher temperature applications (e.g., 2000-3000 K), the fluid volume 170 can include indium. However, the fluid volume 170 can include another material depending upon application and temperature ranges associated with the heat source 160.

As described in relation to a sealing operation state described below, the fluid volume 170 is preferably used at a pressure state lower than that of environmental pressure (e.g., atmospheric pressure) during normal operation. The low pressure state thus allows for the fluid to undergo phase changes at desired temperatures in relation to efficient heat transfer from the heat source 160 during operating temperatures of the heat source 160. However, the pressure existing within the internal volume of the thermally conductive body 110 can be selected to adjust temperatures of phase change transitions according to application (e.g., type of heat source, operating temperatures of heat source).

Figure 2:
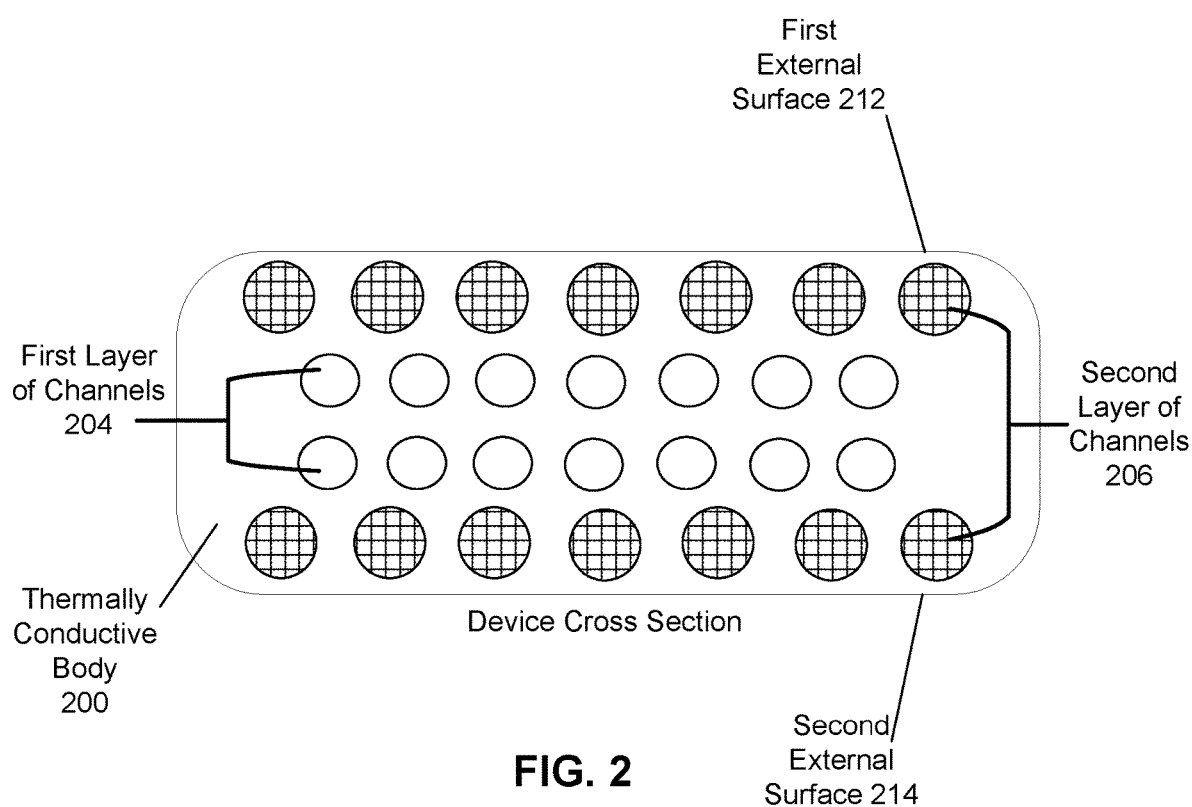
FIG. 2 depicts a variation of a channel configuration in which there are multiple layers of channels in a heat management device, in accordance with one or more embodiments.

FIG. 2 depicts a portion of a cross section of a thermally conductive body 200 that includes a first external surface 212, a second external surface 214, and multiple layers of channels, in accordance with one or more embodiments. The thermally conductive body 200 is a variation of the thermally conductive body 110. The thermally conductive body 200 includes a network of channels can include a first layer of channels 204 at a first depth within the thermally conductive body 200 and a second layer of channels 206 at a second depth within the thermally conductive body 200, in order to transmit heat from an external surface through multiple channel depths. The different depths of channels can be configured to be fluidly uncoupled from each other, or can alternatively be configured to be fluidly coupled to each other (e.g., through a connecting channel connecting a channel at the first depth to a channel at a second depth). Furthermore, in relation to fluid volumes described above, the first layer of channels 204 can have a first fluid retained therein, and the second layer of channels 206 can have a second fluid retained therein, in order to provide different desired heat transfer characteristics across different depths of the heat management device. However, the first layer of channels 204 and the second layer of channels 206 can have identical fluids retained therein.

Figure 3:
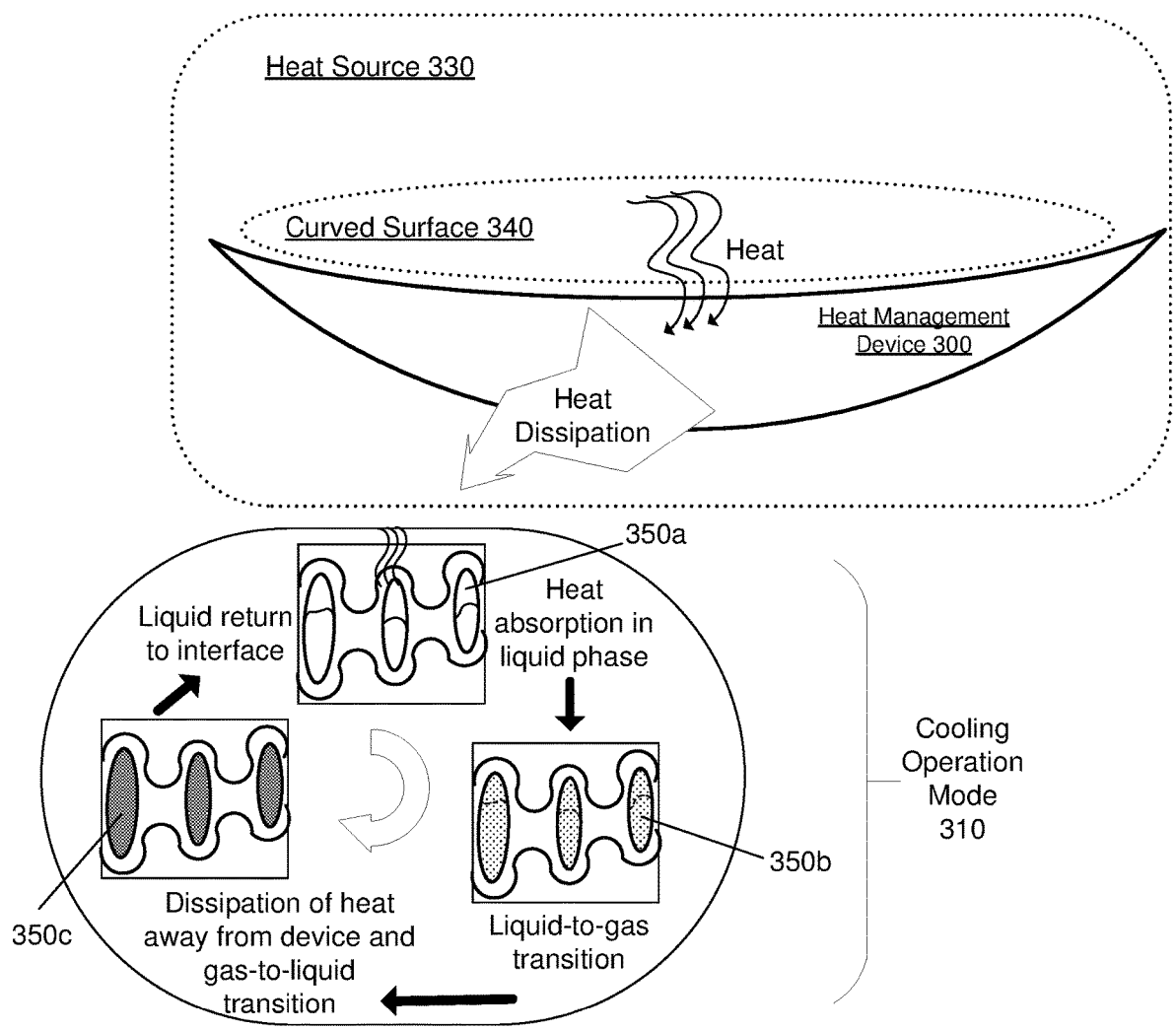
FIG. 3 depicts an operation mode of a heat management device, in accordance with one or more embodiments.

FIG. 3 depicts a cooling operation mode 310 of a heat management device 300, in accordance with one or more embodiments. The heat management device 300 is an embodiment of the heat management device 100. The cooling operation mode 310 allows the heat management device 300 to cyclically transfer heat from the curved surface 340 of the heat source 330 (which are embodiments of the curved surface 150 and heat source 160) in a repeatable manner. In the variation of the cooling operation mode 310 shown in FIG. 3, a fluid volume in a liquid state 350a absorbs heat from the heat source 330 through the non-planar interface with the curved surface 340 of the heat source 330, undergoes a phase transition to a gas state 350b, returns to the liquid state upon dissipating heat away 350c from the heat source 330, and travels back toward the non-planar interface through a variation of the network of channels described above. In dissipating heat away from the heat source, the heat management device 300 can dissipate heat to a second heat dissipation surface or body (e.g., a second heat dissipation surface internal to a device that contains the heat management device 300 and the second heat dissipation surface). As such, the heat management device 300 can operate as an isothermal heat rejection system through the phase transitions of the fluid volume in the cooling operation mode. In alternative variations of the cooling operation mode 310, the material(s) contained within the internal volume of the thermally conductive body can undergo transitions between other phases in order to promote heat rejection from the heat source 330.

Figure 4A:
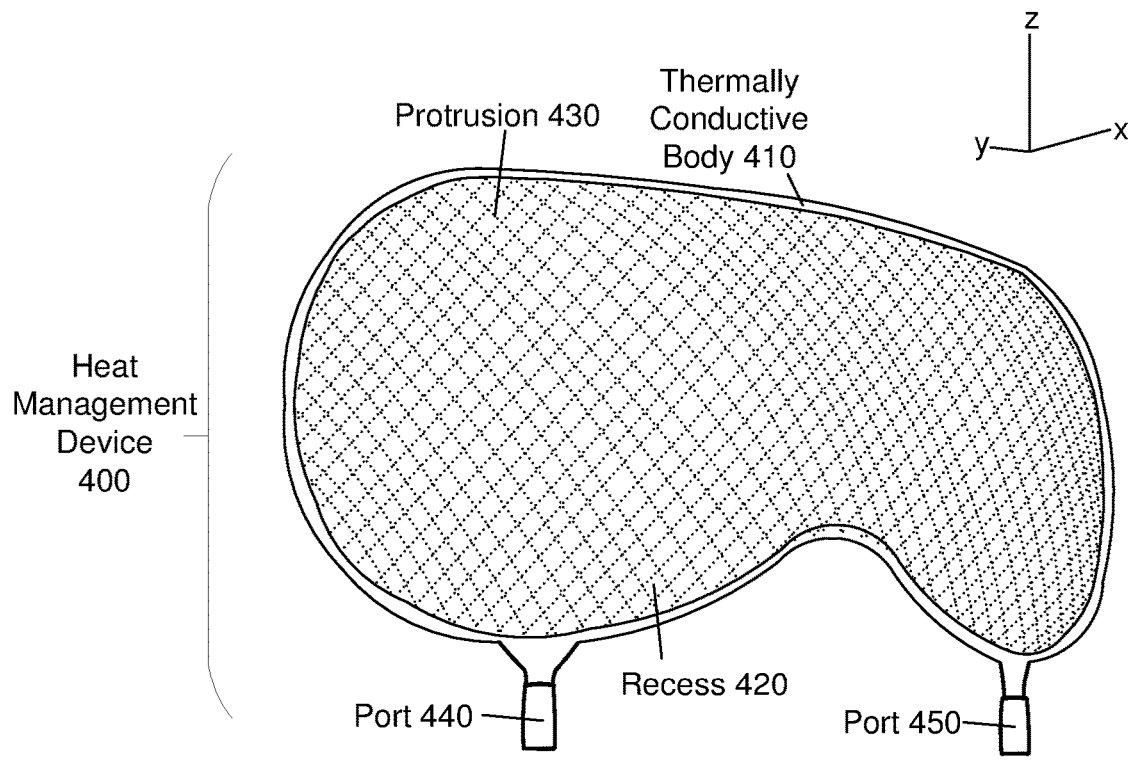
FIG. 4A depicts a first isometric view from the front left of an example heat management device, in accordance with one or more embodiments.
Figure 4B:
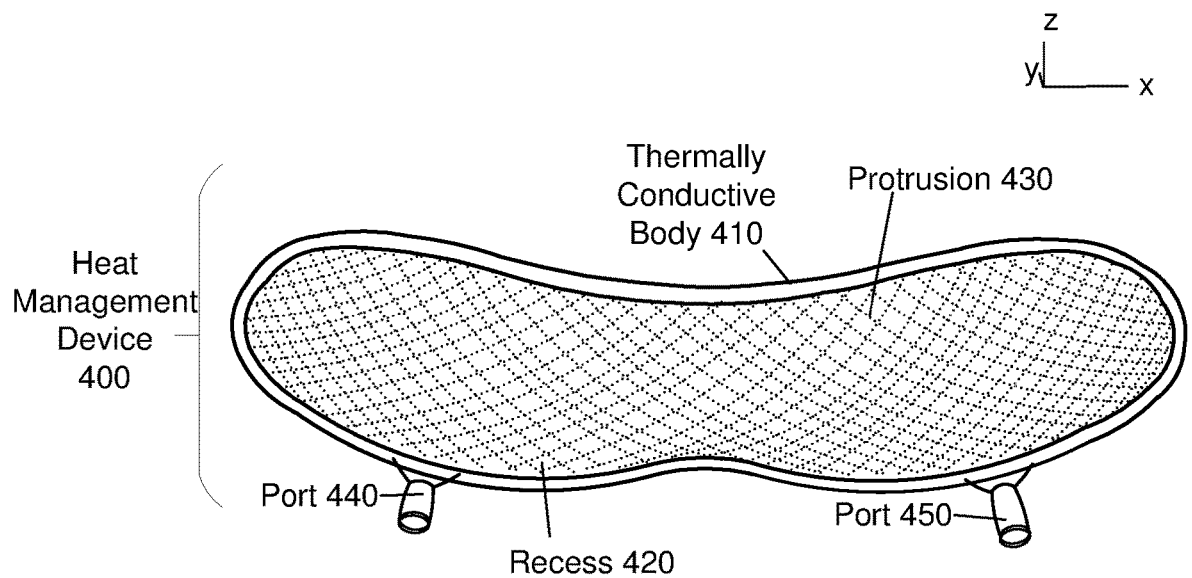
FIG. 4B depicts a second isometric view from the bottom-backside of the example heat management device of FIG. 4A.

FIG. 4A depicts a first isometric view from the front left of an example heat management device, in accordance with one or more embodiments. FIG. 4B depicts a second isometric view from the bottom-backside of the example heat management device of FIG. 4A. FIG. 4C depicts a bottom view of the example heat management device of FIG. 4A. FIG. 4D depicts a front view of the example heat management device of FIG. 4A.

In the example heat management device of FIGS. 4A-4D, the thermally conductive body 410 is composed of titanium processed to a powdered metal form, and then sintered layer by layer, using a laser, to form structures of the heat management device 400, as further described in relation to the method of manufacture 900 below. In the specific example, a recess 420 of the array of recesses can have a diameter from 1-15 millimeters and/or a depth from 1 to 10 millimeters. However, the recesses of the array of recesses can alternatively have any other suitable dimensions in relation to morphological features. In related specific examples, the thermally conductive body 410 can be composed of multiple materials (e.g., a combination of materials, a composite material, an alloy) processed according to another method.

Also shown in FIGS. 4A-4D, an array of recesses, an array of protrusions including protrusion 430, and/or internal volume aspects can be configured without any predominating direction of alignment, thereby preventing undesired deformation of the device thermally conductive body during operation, in relation to thermally-induced stresses and/or stresses associated with pressure differentials between internal contents of the device and the outside environment. In examples, an array of recesses can have an ordered configuration (e.g., packed configuration, close packed configuration, hexagonal close packed configuration, rectangular configuration, radially-symmetric configuration) with appropriate spacing between adjacent recesses to prevent deformation. However, the array of recesses can alternatively have a randomly-distributed configuration in other examples. Still alternatively, the array of recesses can be configured with one or more predominating alignment directions, such that the device deforms in a desired manner during operation of the system. Similarly, an array of protrusions can have an ordered configuration or random configuration about recesses of the array of recesses. Alternatively, the array of protrusions can be configured with one or more predominating alignment directions, such that the device deforms in a desired manner during operation.

Also shown in FIGS. 4A and 4D are port 440 and port 450, which are embodiments of the ports 530, 630, and 640, described in more detail below in relation to FIGS. 5 and 6.

Figure 5:
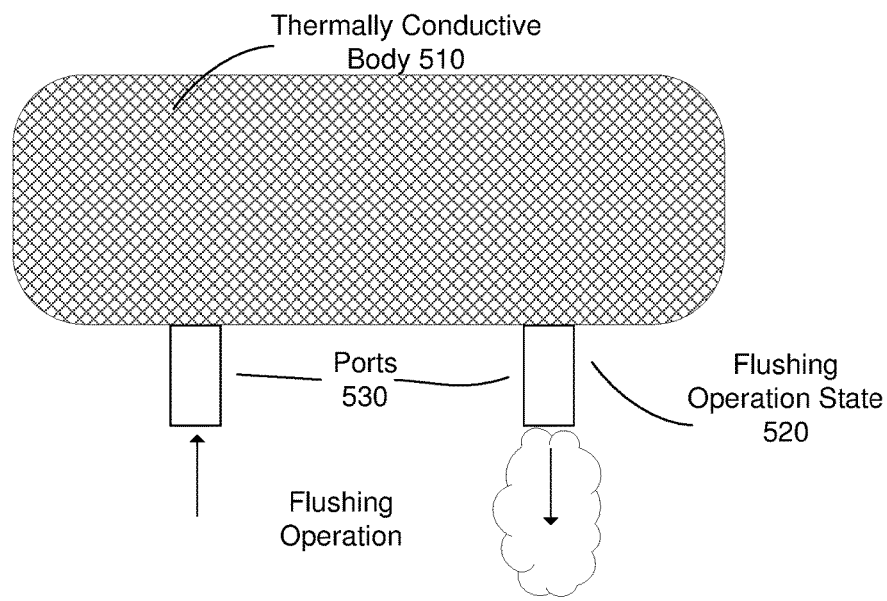
FIG. 5 depicts an operation state of a heat management device, in accordance with one or more embodiments.

FIG. 5 depicts an operation state of a heat management device, in accordance with one or more embodiments. The heat management device may be, e.g., the heat management device 100 and/or the heat management device 300. The operation state of the heat management device shown in FIG. 5 can be associated with a 3D printing process involving powdered metal material, wherein residual powdered metal material from the 3D printing process contained within the internal volume of the thermally conductive body is subsequently removed from the internal volume through a set of ports printed with the heat management device during fabrication. The heat management device can thus have a flushing operation state 520 associated with the method 900 of manufacture described below. Structural aspects of the heat management device can be configured appropriately in the flushing operation state 520. For instance, in the flushing operation state 520 the thermally conductive body 510 of the heat management device can include a pair of ports 530 that transmit metal powder from within the internal volume, wherein the metal powder is residual powder from a metal printing process implementing powder in metal form.

Figure 6:
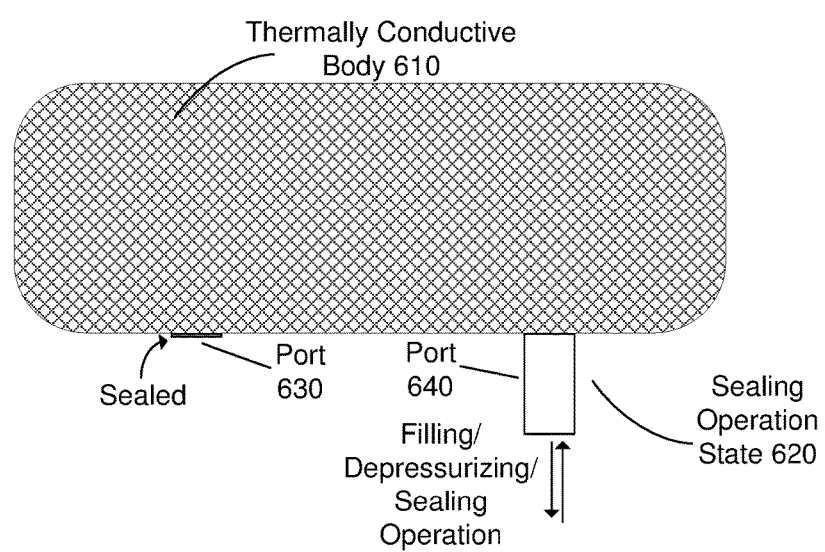
FIG. 6 depicts another operation state of a heat management device, in accordance with one or more embodiments.

FIG. 6 depicts another operation state of a heat management device, in accordance with one or more embodiments. The heat management device can have a sealing operation state 620 associated with the method of manufacture 900 described below, and as a state subsequent to the operation state shown in FIG. 5, wherein the sealing operation state is associated with sealing of the internal volume and contents retained therein in order to produce a closed system. As such, a fluid volume can be sealed within the internal volume of the heat management device and retained in a desired state (e.g., pressure state) relative to an external environment. Structural aspects of the heat management device can be configured appropriately in the sealing operation state 620. For instance, in the sealing operation state 620, a sub-portion 630 of ports is sealed (e.g., a first port of a pair of ports is sealed) and a remaining sub-portion 640 of ports (e.g., a second port of a pair of ports) facilitates depressurization and transmission of the fluid volume into the internal volume. Then, the remaining sub-portion 640 of ports is sealed so that the thermally conductive body 610 of the heat management device can operate as a closed system in interfacing with the heat source.

Heat Management Device—Additional Elements

The heat management device can additionally or alternatively include additional structures and/or elements that promote improved heat management operation.

Figure 7:
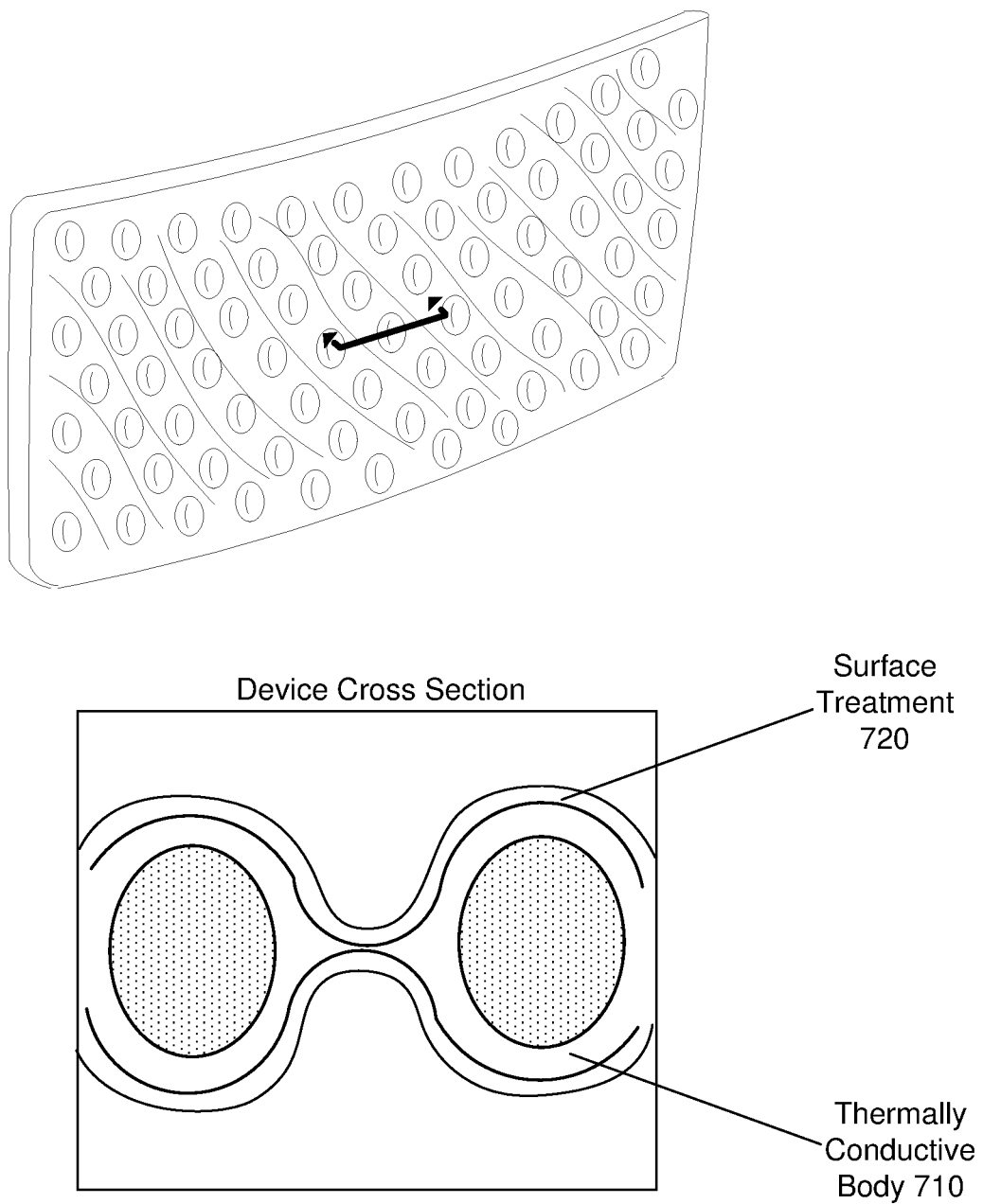
FIG. 7 depicts additional surface features of a heat management device, in accordance with one or more embodiments.

FIG. 7 depicts additional surface features of a heat management device, in accordance with one or more embodiments. The thermally conductive body 710 of the heat management device can include a surface treatment 720 that promotes a reduction in surface imperfections (e.g., porosity, stress concentrations) that if, untreated, could reduce structural robustness and/or reduce efficiency of operation of the device. The surface treatment 720 can include a coating, and in variations, the coating can include one or more of: an epoxy coating, a thermally-conductive polymer coating, a powder coating, and any other suitable coating. The surface treatment can additionally or alternatively include a particle impregnation treatment.

Figure 8A:
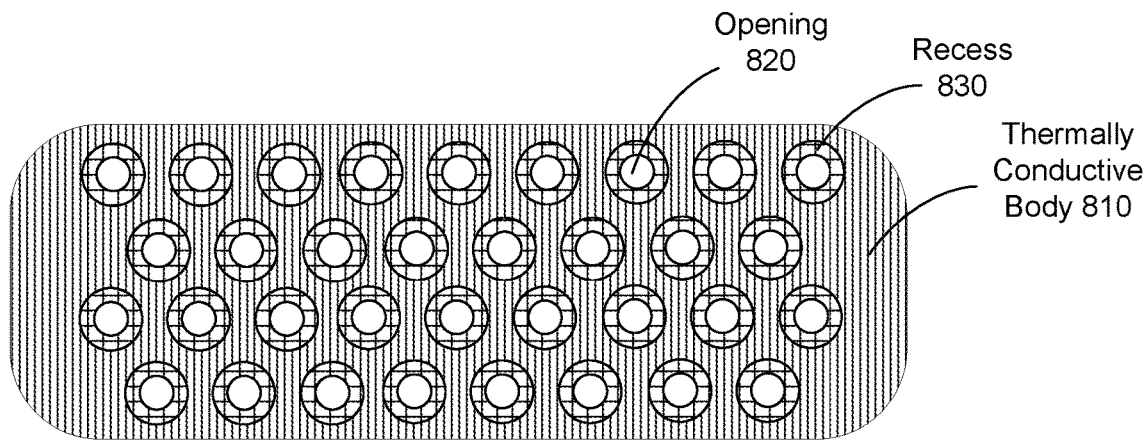
FIG. 8A depicts a portion of a front view of an external surface of a thermally conductive body that includes openings, in accordance with one or more embodiments.

FIG. 8A depicts a portion of a front view of an external surface of a thermally conductive body that includes a plurality of openings, in accordance with one or more embodiments of a heat management device, a general version of which is shown in FIG. 1A. The thermally conductive body 810 of the heat management device can include one or more openings 820 that allow air to flow through the heat management device, thereby promoting an additional mechanism for heat transfer. As shown in FIG. 8A, at least some recesses of an array of recesses, including recess 830, can include a respective opening that allows air to flow through the opening between a first external surface and a second external surface of the thermally conductive body 810. The openings 820 can be centered (e.g., concentrically centered) with their respective recesses 830; however, the openings 820 can alternatively be non-centered relative to respective recesses 830. Furthermore, each recess may not have its own opening. The openings are preferably smaller in dimension (e.g., diameter) than footprints of respective openings, and preferably do not provide access points between external and internal surfaces of the thermally conductive body 810. However, the openings can alternatively have any other suitable dimension and/or be positioned relative to the recesses in any other suitable manner. Furthermore, the openings can be positioned away from the recesses and/or protrusions, for instance, at peripheral regions of the thermally conductive body 810.

In relation to protrusions of the heat management device, the device can additionally or alternatively include surface features that increase surface area for heat transfer away from the heat source. In variations, the surface features can include fins or other surface extenders positioned at regions of the thermally conductive body away from the heat source, in order to promote heat rejection from the heat source.

Figure 8B:
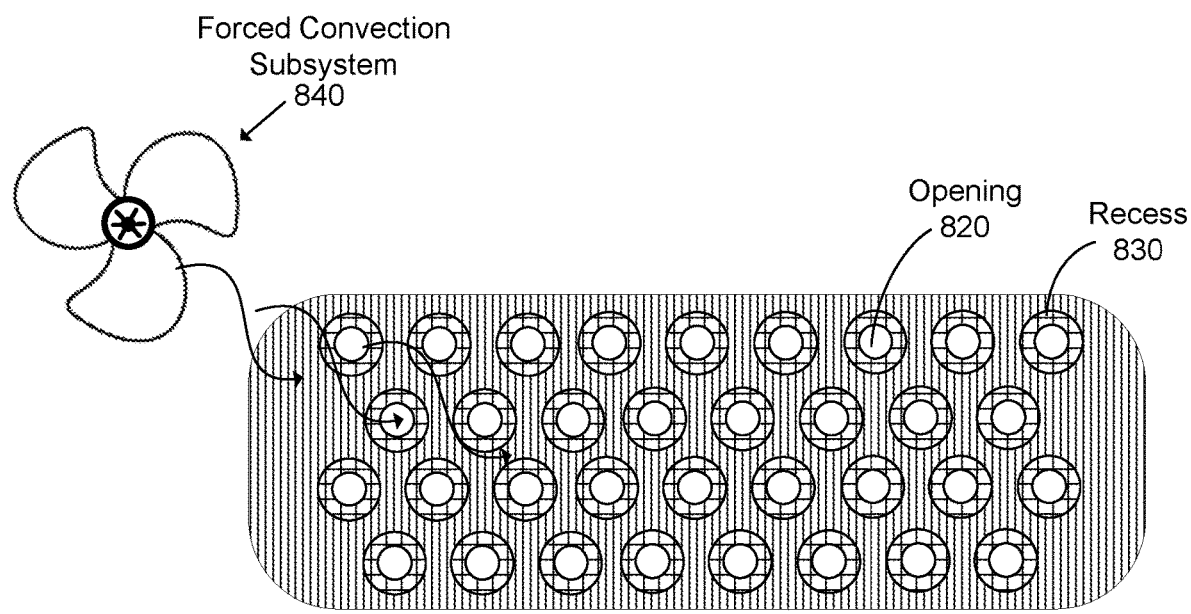
FIG. 8B depicts a portion of a front view of an external surface of a thermally conductive body that includes a forced convection subsystem, in accordance with one or more embodiments.

FIG. 8B depicts a portion of a front view of an external surface of a thermally conductive body that includes a forced convection subsystem, in accordance with one or more embodiments of a heat management device, a general version of which is shown in FIG. 1A. The thermally conductive body 810 of the heat management device can include a forced convection subsystem 840 that allows air to flow through the heat management device. The forced convection subsystem 840 can thus provide another mechanism for heat transfer. In variations, the forced convection subsystem 840 can include an air-driving subsystem (e.g., a fan, a channel) and/or a fluid-driving subsystem (e.g., a channel or fluid container that allows fluid flow of a coolant fluid over or through surfaces of the thermally conductive body). In a specific example, the forced convection subsystem 840 includes a fan that allows for forced convection of heat from the thermally conductive body using environmental air as a medium. The forced convection subsystem 840 can drive air or another fluid along surfaces of recesses and/or protrusions to promote effective heat transfer. Additionally or alternatively, in variations of the heat management device including openings 820, the forced convection subsystem 840 can drive environmental air through each of the openings from a first external surface through to another external surface. Additionally or alternatively, in variations of the heat management device including fins, the forced convection subsystem 840 can drive environmental air along the fins.

While embodiments, variations, and examples of the heat management device have been described as a fluidly closed system during operation, in alternative variations, the internal volume of the thermally conductive body can be fluidly open to allow fluid flow with forced convection through the network of cavities. In these alternative variations, fluid (e.g., coolant fluid) can be driven through the internal volume, for instance, using a pump or other pressure applying mechanism.

However, the heat management device can additionally or alternatively include any other suitable elements that promote improved heat management operation.

Method of Manufacture

Figure 9:
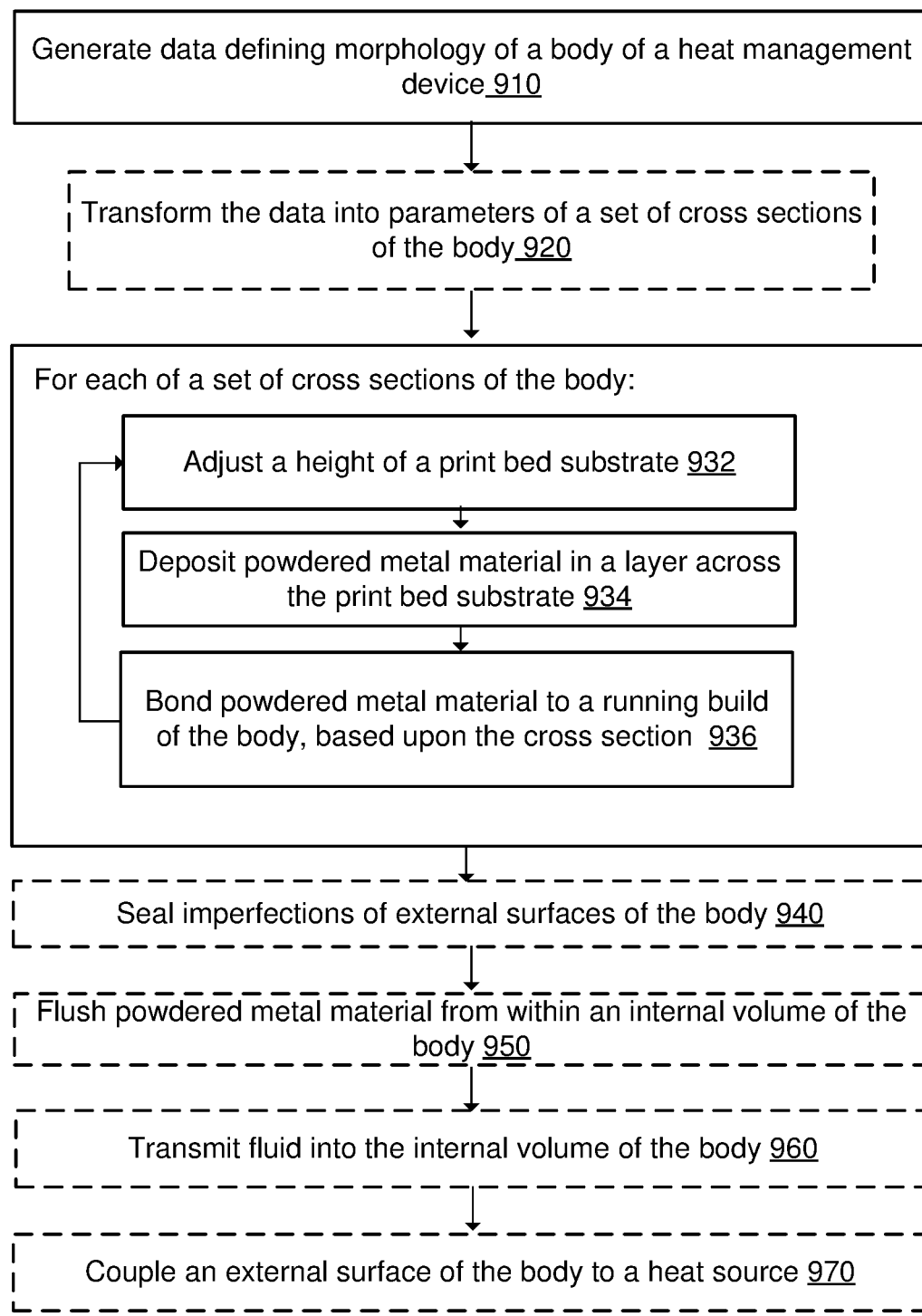
FIG. 9 depicts a flow chart of a method of manufacture of a heat management device, in accordance with one or more embodiments.

FIG. 9 is a flowchart of a method 900 of manufacture of a heat management device, in accordance with one or more embodiments. The method 900 of FIG. 9 may be performed using a manufacturing system. The manufacturing system may include a computer-aided design (CAD) system in communication with a 3D printing system that builds components using powdered metal material. In embodiments, as described below, the 3D printing system may include a selective laser melting (SLM™) or direct metal laser sintering (DMLS®) system that includes a print bed coupled to an actuator, a metal powder depositor that provides and distributes metal powder across the print bed (e.g., using a roller), and a heat generator (e.g., laser, electron beam source, etc.) coupled to an actuation system that moves the heat generator relative to the print bed during a build process. Other entities may perform some or all of the steps of the method in other embodiments. Likewise, embodiments may include different and/or additional steps, or perform the steps in different orders. The method 900 functions to generate a custom heat management solution using an untraditional process and untraditional materials for such heat management devices, that allow for structural and operational improvements to existing technologies, as described above.

The manufacturing system generates 910 data defining morphology of a body of the heat management device in order to generate computer-readable data that defines external and/or internal morphological features of the body of the heat management device. The data may define features of embodiments, variations, or examples of the thermally conductive body described above; however, the data may alternatively define features of a body of another custom heat management device. The computer-readable data may be data in a three-dimensional computer-CAD format or any other suitable format that can be processed in in downstream steps of the method 900.

The manufacturing system transforms 920 the data into parameters of a set of cross sections of the body in order to transform the data into a format that can be used by a 3D printing system. In relation to the manufacturing process, The CAD system can transform 920 the data by dividing volumetric data into two-dimensional cross sections of the body, wherein division into cross sections is based on one or more of: appropriate orientation of the body within a build chamber or on a substrate associated with the manufacturing process; cross-section thickness associated with appropriate thicknesses for each section being bonded to a running build of the body; feature resolution capabilities of the manufacturing apparatus; and any other suitable factor. Dividing the data into cross sections can be implemented automatically using a sectioning algorithm that uses manufacturing-related considerations as boundary constraints. Alternatively, dividing the data into cross sections can be implemented manually. Still alternatively, the CAD system can directly generate 920 cross sectional data and omit generating 910 volumetric data of the body.

The data is received by the manufacturing system (e.g., a 3D printing system of the manufacturing system and, for each of the set of cross sections of the body, the manufacturing system adjusts 932 a height of a print bed substrate, the manufacturing system deposits 934 powdered metal material in a layer across the print bed substrate, and the manufacturing system bonds 936 powdered metal material to a running build of the body, based upon the cross section.

The manufacturing system adjusts 932 the print bed substrate height, and may lower the print bed substrate to an appropriate height that allows a cross section to be bonded, in sequence, to a running build of the body. In this configuration, the body can be built from the bottom upward, relative to the orientation of the body at the print bed substrate. The 3D printing system may additionally or alternatively adjust a height or lateral position of the print bed substrate in any other suitable manner, for each cross sectional layer being built.

The manufacturing system deposits 934 powdered metal material and may deliver an appropriate volume of powdered metal material onto the print bed substrate and, simultaneously or in a subsequent step, ensure that the volume of powdered metal material is distributed uniformly (e.g., in a uniformly-thick layer) across the print bed substrate. The powdered metal material can have a composition suited to the application of use of the heat management device, as described in relation to the System above. The powdered metal material can also have a particle size (and level of uniformity in particle size) that produces desired surface characteristics for the final product (e.g., in terms of allowable roughness, in terms of allowable porosity, etc.). In specific examples, the particle sizes of the powdered metal material used are below 30 microns in diameter; however particle sizes of the powdered metal material used can alternatively be greater than or equal to 30 microns in diameter (e.g., up to 200 microns in diameter).

The manufacturing system bonds 936 powdered metal material and may melt or sinter powdered material of the layer deposited onto a running build of the body retained at the print bed substrate. Bonding 936 by the 3D printing system can be implemented using a laser coupled to an actuator that produces movement of the laser relative to the print bed substrate in one or more lateral directions, wherein activation and/or deactivation of the laser selective bonds material to the running build. The laser can additionally or alternatively be optically coupled to optical elements (e.g., lenses, mirrors, etc.) that adjust features of the laser output incident on the desired build surface. Bonding parameters can be based upon one or more of: powdered metal material particle size, powdered metal material composition, mass of actuator components (e.g., gantry mass, laser head mass, etc.) coupled to the laser, laser output-associated parameters (e.g., wavelength, power, intensity, irradiance, beam shape, etc.), build environment parameters (e.g., volume of a build environment, oxygen content in build environment, other gas content in build environment, temperature of build environment, etc.), and any other suitable build parameters. In a specific example, the 3D printing system can use a fiber laser (e.g., ytterbium fiber laser). In alternative variations, the 3D printing system can use an electron beam output device or any other suitable source of energy that causes metal particles to melt or be sintered to a running built of the body.

The manufacturing system may optionally include a surface treatment system, which can seal 940 imperfections of external surfaces of the body. As described in relation to element 260 above, sealing imperfections or other undesired surface aspects of the body can include implementing a surface treating procedure including one or more of a coating procedure (e.g., an epoxy coating procedure, a thermally-conductive polymer coating procedure, a powder coating procedure, etc.). The surface treating procedure can additionally or alternatively include performing a particle impregnation procedure to embed particles into surfaces of the body.

The manufacturing system may optionally include a flushing system, which can flush 950 powdered metal material from within an internal volume of the body. Flushing can remove loose metal particles from the internal volume of the body, thereby preventing the loose particles from causing undesired behavior of the device during operation (e.g., due to channel clogging, due to creation of heat concentration regions, etc.). Flushing powdered metal material can include transmitting fluid (e.g., air, water, another fluid) into one or more inlet ports of the body and out through one or more outlet ports of the body, thereby carrying loose metal material from within the internal volume with fluid flow.

The manufacturing system may optionally include a fluid transmission system, which can transmit 960 fluid into the internal volume of the body, wherein the fluid is retained within the internal volume during normal operation of the heat management device. Transmitting fluid can include transmitting fluid in a depressurized state (e.g., at a state having a lower pressure than environmental pressure) into the internal volume through one or more inlet ports into the internal volume. As such, in transmitting fluid, the fluid transmission system, with other systems can seal at least a sub-portion of ports providing access to the internal volume of the body, and then, after fluid transmission into the body, seal off remaining ports (e.g., by welding, by plugging, etc.) so that the heat management device can operate as a closed system in interfacing with the heat source.

The manufacturing system may optionally include a fastening system, which can couple 970 an external surface of the body to a heat source. Coupling the body to a heat source functions to establish a thermal interface between the heat management device and the heat source in order to provide a mechanism for efficient heat rejection from the heat source. Coupling the body to the heat source also functions to allow the heat management device to structurally support the heat source and/or other device components associated with the heat source in a manner not achievable before. The fastening system can implement mechanical fasteners (e.g., screws, bolts, etc.), adhesives, thermal fastening elements, magnetic fasteners, and/or any other suitable type of fastener.

As indicated above, embodiments of a heat management device can alternatively be produced according to another method. In one such alternative manufacturing method, manufacture of a heat management device can include a casting and dipping process (or other encasing process). For instance, a cast of the network of channels described above can be generated using a first material, which can then be encased (e.g., by dipping) in a second material that is thermally conductive. Then, the first material can be removed (e.g., using a thermal process, using a chemical process, using a mechanical process, using a light-activated process, etc.) in order to form the network of channels within a thermally conductive body. In another alternative manufacturing method, manufacture of a heat management device can include molding or casting separate pieces (e.g., halves) of the thermally conductive body and its network of channels, and the separate pieces can be bonded together (e.g., using a thermal bonding process, using an adhesive bonding process, using a chemical bonding process, etc.). However, manufacture of the heat management device can be performed in another suitable manner.

Example System Environments Associated with the Heat Management Device

The artificial reality system can include a head-mounted display that presents content to a user comprising virtual and/or augmented views of a physical, real-world environment with computer-generated elements (e.g., two-dimensional (2D) or three-dimensional (3D) images, 2D or 3D video, sound, etc.). In some embodiments, the presented content includes audio that is presented via an external device (e.g., speakers and/or headphones) that receives audio information and presents audio data based on the audio information. The may comprise one or more rigid bodies, which may be rigidly or non-rigidly coupled together and/or structurally supported by embodiments, variations, or examples of the heat management device described above. A rigid coupling between rigid bodies causes the coupled rigid bodies to act as a single rigid entity.

The HMD can include one or more of: a DCA, an electronic display, an optical assembly, one or more position sensors, an IMU, an optional eye tracking system, and an optional varifocal module that, in combination with a computer processing subsystem, can produce heat during operation. Some embodiments of the HMD can additionally or alternatively have any other suitable elements. Additionally, the functionality provided by various components described may be differently distributed among the components of the HMD in other embodiments.

Additional Configuration Information

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like, in relation to manufacturing processes. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described (e.g., in relation to manufacturing processes.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability. Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A heat-management device comprising:
an array of recesses distributed across a first external surface of a thermally conductive body, at least a portion of the thermally conductive body being composed of a metal, and the portion of the thermally conductive body having been formed using a 3 dimensional metal printing process;
an array of protrusions interspersed with the array of recesses and forming a network of cavities within an internal volume of the thermally conductive body, the array of recesses and the array of protrusions defining a non-planar interface that is configured to be coupled to a curved surface of a heat source and the non-planar interface has a curvature that is matched to fit the curved surface of the heat source; and
wherein a volume of fluid is retained within the network of cavities, the volume of fluid absorbs heat from the heat source through the non-planar interface and dissipates heat away from the heat source through the network of cavities.

2. The heat-management device of claim 1, wherein the the printable metal comprises at least one of a material including titanium, a material including tungsten, and a material including steel.

3. The heat-management device of claim 1, wherein the array of recesses and the array of protrusions comprise curved edges.

4. The heat-management device of claim 1, wherein the thermally conductive body is mounted to the heat source and provides structural support to the heat source.

5. The heat-management device of claim 1, wherein the thermally conductive body includes a second external surface that is opposite the first external surface, and the array of recesses is distributed across the second external surface, and wherein the network of cavities forms a lattice network of channels.

6. The heat-management device of claim 5, wherein the lattice network of channels provides the thermally conductive body with a structural stiffness resistant to deformation.

7. The heat-management device of claim 1, wherein in a flushing operation state, the thermally conductive body comprises a pair of ports that transmit metal powder from within the internal volume, and wherein in a sealing operation state, a first port of the pair of ports is sealed and a second port of the pair of ports facilitates depressurization and transmission of the volume of fluid into the internal volume.

8. The heat-management device of claim 1, wherein external surfaces of the thermally conductive body comprise a surface sealing treatment comprising at least one of an epoxy coating and particle impregnation.

9. The heat-management device of claim 1, wherein the heat source is a component of a head-mounted display, and wherein the curved surface comprises a curved surface of a face plate of the head-mounted display.

10. The heat-management device of claim 1, wherein some recesses of the array of recesses each include a respective opening, and each channel allows air to flow through the opening between the first external surface and a second external surface of the thermally conductive body.

11. The heat-management device of claim 10, further comprising a fan that blows air through each of the openings.

12. The heat-management device of claim 1, wherein a wall between a cavity of the network of cavities and the first external surface is at most 200 microns thick.

13. The heat-management device of claim 1, wherein the network of cavities comprises a first layer of channels at a first depth within the thermally conductive body and a second layer of channels at a second depth within the thermally conductive body.

14. The heat-management device of claim 1, wherein the volume of fluid in a liquid state absorbs heat from the heat source through the non-planar interface, undergoes a phase transition to a gas state, returns to the liquid state upon dissipating heat away from the heat source, and travels back toward the non-planar interface through the network of cavities.

15. The heat-management device of claim 1, wherein the volume of fluid is retained within the network of cavities at a pressure lower than atmospheric pressure.

16. The heat-management device of claim 1, wherein the non-planar interface provides coverage of a portion of the curved surface of the heat source.

17. A method comprising:
forming a thermally conductive body, at least a portion of the thermally conductive body being composed a metal, and the portion of the thermally conductive body was formed using a 3 dimensional printing process, the thermally conductive body including:
an array of recesses distributed across a first external surface of the thermally conductive body; and
an array of protrusions interspersed with the array of recesses and defining a network of cavities within an internal volume of the thermally conductive body, the array of recesses and the array of protrusions defining a non-planar interface configured to be coupled to a curved surface of a heat source and the non-planar interface has a curvature that is matched to fit the curved surface of the heat source; and
retaining a volume of fluid within the network of cavities, and the volume of fluid absorbs heat from the heat source through the non-planar interface and dissipates heat away from the heat source through the network of cavities.

18. The method of claim 17, wherein forming the thermally conductive body comprises generating data defining the morphology of a body that comprises the array of recesses and the array of protrusions.

19. The method of claim 18, wherein forming the thermally conductive body further comprises transforming the data into parameters of a set of cross sections of the body, and for each of the set of cross sections of the body:
adjusting the height of a print bed substrate, the height corresponding to the cross section of the body,
depositing powdered metal material in a uniform layer across the print bed substrate, and
bonding, using a laser, powdered metal material of the uniform layer to a running build of the body, based upon the cross section.

20. The method of claim 19, further comprising sealing surface imperfections of the thermally conductive body upon performing at least one of: dipping external surfaces of the thermally conductive body in an epoxy material and applying an impregnation process to external surfaces of the thermally conductive body.

21. The method of claim 19, further comprising: by way of the pair of ports, transmitting metal powder from within the internal volume of the thermally conductive body with a flushing operation, sealing a first port of the pair of ports, and transmitting the volume of fluid into the network of cavities at a pressure lower than atmospheric pressure through a second port of the pair of ports.

22. A system comprising:
a heat management device coupled to one or more heat-generating surfaces of a head-mounted display, and the one or more heat-generating surfaces includes at least one curved surface, the heat management device comprising:
an array of recesses distributed across a first external surface of a thermally conductive body, at least a portion of the thermally conductive body being composed of a metal, and the portion of the thermally conductive body having been formed using a 3 dimensional metal printing process,
an array of protrusions interspersed with the array of recesses and forming a network of cavities within an internal volume of the thermally conductive body, the array of recesses and the array of protrusions defining a non-planar interface that is configured to be coupled to the curved surface and the non-planar interface has a curvature that is matched to fit the curved surface, and
a volume of fluid is retained within the network of cavities, and the volume of fluid absorbs heat at the non-planar interface and dissipates heat away from the one or more heat-generating surfaces through the network of cavities, and
wherein the head-mounted display comprises:
a housing retaining an electronic display in position, and
electronic circuitry coupled to the electronic display, the electronic circuitry comprising a processor and memory comprising instructions in non-transitory computer-readable media for providing digital content at the display.

23. The system of claim 22, wherein the heat-management device comprises:
a titanium body defining the array of recesses and the array of protrusions, wherein the titanium body is mounted to one or more of the heat-generating surfaces and provides structural support to the head-mounted display, and
wherein each cavity of the network of cavities has a characteristic diameter from 0.1 millimeter to 5 millimeters, wherein a wall between a cavity of the network of cavities and the first external surface is at most 200 microns thick.

* * * * *

UNITED STATES PATENT AND TRADEMARK OFFICE
CERTIFICATE OF CORRECTION

PATENT NO. : 11,076,510 B2  
APPLICATION NO. : 16/102435  
DATED : July 27, 2021  
INVENTOR(S) : Stellman It is certified that error appears in the above-identified patent and that said Letters Patent is hereby corrected as shown below:

In the Claims

In Column 20, Claim 2, Lines 14-15, delete "wherein the the" and insert -- wherein the --, therefor.

In Column 21, Claim 17, Line 13, delete "composed a" and insert -- composed of a --, therefor.

Signed and Sealed this  
Twenty-second Day of March, 2022

Drew Hirshfeld  
*Performing the Functions and Duties of the*  
*Under Secretary of Commerce for Intellectual Property and*  
*Director of the United States Patent and Trademark Office*